United States Patent
Inoue

(10) Patent No.: US 11,646,250 B2
(45) Date of Patent: May 9, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Daisuke Inoue, Himeji Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 316 days.

(21) Appl. No.: 17/003,939

(22) Filed: Aug. 26, 2020

(65) Prior Publication Data

US 2021/0280500 A1    Sep. 9, 2021

(30) Foreign Application Priority Data

Mar. 6, 2020   (JP) .............................. JP2020-038792

(51) Int. Cl.
*H01L 23/495* (2006.01)
*H01L 23/00* (2006.01)

(52) U.S. Cl.
CPC .. *H01L 23/49524* (2013.01); *H01L 23/49513* (2013.01); *H01L 24/32* (2013.01); *H01L 24/33* (2013.01); *H01L 24/40* (2013.01); *H01L 2224/32245* (2013.01); *H01L 2224/33181* (2013.01); *H01L 2224/40105* (2013.01); *H01L 2224/40175* (2013.01); *H01L 2224/40475* (2013.01)

(58) Field of Classification Search
CPC ......... H01L 24/31; H01L 24/32; H01L 24/37; H01L 24/40; H01L 2224/32245; H01L 2224/40105; H01L 2224/40175; H01L 2224/40475; H01L 2224/40477
See application file for complete search history.

(56) References Cited

U.S. PATENT DOCUMENTS

| | | |
|---|---|---|
| 5,001,545 A | 3/1991 | Kalfus |
| 2015/0239093 A1 | 8/2015 | Fukui et al. |
| 2018/0174998 A1* | 6/2018 | Sato ............... H01L 24/91 |
| 2018/0240942 A1 | 8/2018 | Ootorii |

(Continued)

FOREIGN PATENT DOCUMENTS

| | | |
|---|---|---|
| JP | H02126659 A | 5/1990 |
| JP | H07016370 | 3/1995 |
| JP | H10294473 A | 11/1998 |

(Continued)

*Primary Examiner* — Tucker J Wright
(74) *Attorney, Agent, or Firm* — Kim & Stewart LLP

(57) ABSTRACT

A semiconductor device includes metal connector plate having a first lower surface, facing an electrode of a semiconductor chip, a first end surface, a second end surface, and a second lower surface connecting the first end surface and the second end surface. In a first direction parallel to the semiconductor chip, an end surface of the electrode is located between the positions of the first end surface and the second end surface. A distance from the second lower surface to the electrode is greater than a distance from the first lower surface to the electrode. A joining component has a first portion between the first lower surface and the electrode and a second portion between the second lower surface and the electrode.

20 Claims, 6 Drawing Sheets

(56) References Cited

U.S. PATENT DOCUMENTS

2019/0066926 A1 2/2019 Onoue et al.
2019/0214334 A1* 7/2019 Ikeda ................ H01L 23/49548

FOREIGN PATENT DOCUMENTS

| JP | 2006005112 A | 1/2006 |
|---|---|---|
| JP | 2010267741 A | 11/2010 |
| JP | 2011228405 A | 11/2011 |
| JP | 2011249395 A | 12/2011 |
| JP | 2015160260 A | 9/2015 |

* cited by examiner

SEMICONDUCTOR DEVICE

CROSS-REFERENCE TO RELATED APPLICATION

This application is based upon and claims the benefit of priority from Japanese Patent Application No. 2020-038792, filed Mar. 6, 2020, the entire contents of which are incorporated herein by reference.

FIELD

Embodiments described herein relate generally to a semiconductor device.

BACKGROUND

In recent years, in a power semiconductor device, a structure using a plate-shaped metal connector instead of a wire has been adopted as a connection structure between a semiconductor chip and a frame in order to reduce resistance.

Due to thermal stresses in reliability evaluations of semiconductor devices (e.g., reflow evaluation and temperature cycle test), stress generally occurs at an interface of materials having a different linear thermal expansion coefficients. In a power semiconductor device, for example, stress is applied to a joining component (for example, solder) that joins a silicon semiconductor chip and a copper connector. Particularly, it is known that the stress is concentrated on an end surface of the connector. This stress can be absorbed and dissipated by increasing a thickness of the joining component that covers the end surface of the connector. However, the thickness of the joining component between the semiconductor chip and the connector also becomes thicker, thereby causing not only an increase in the thermal resistance but also an increase in electrical resistance of the joining component, causing a concern that a desired characteristic value for the semiconductor device performance cannot be satisfied.

DETAILED DESCRIPTION

Embodiments provide a semiconductor device capable of improving the reliability of a joint between a semiconductor chip and a metal connector.

In general, according to one embodiment, a semiconductor device comprises a frame and a semiconductor chip. The semiconductor chip has a first surface facing the frame and a second surface facing away from the frame. The first surface is bonded to the frame. The second surface includes an electrode thereon. A metal connector plate is joined to the electrode by a joining component, such as solder or the like, included between the electrode and the metal connector plate. The metal connector plate has an upper surface facing away from the semiconductor chip, a first lower surface facing the electrode, a first end surface intersecting the first lower surface, a second lower surface facing towards the semiconductor chip and intersecting the first end surface, and a second end surface intersecting second lower surface and the upper surface. An end surface of the electrode is at a position along a first direction parallel the second surface that is between a position along the first direction of the first end surface and a position along the first direction of the second end surface. The distance between the second lower surface and the electrode is greater than the distance between the first lower surface and the electrode. The joining component has a first portion between the first lower surface and the electrode and a second portion between the second lower surface and the electrode. The second portion contacts the second end surface and is thicker than the first portion.

Hereinafter, certain example embodiments will be described with reference to the drawings. In each drawing, the same elements will be denoted by the same reference signs.

Figure 1:
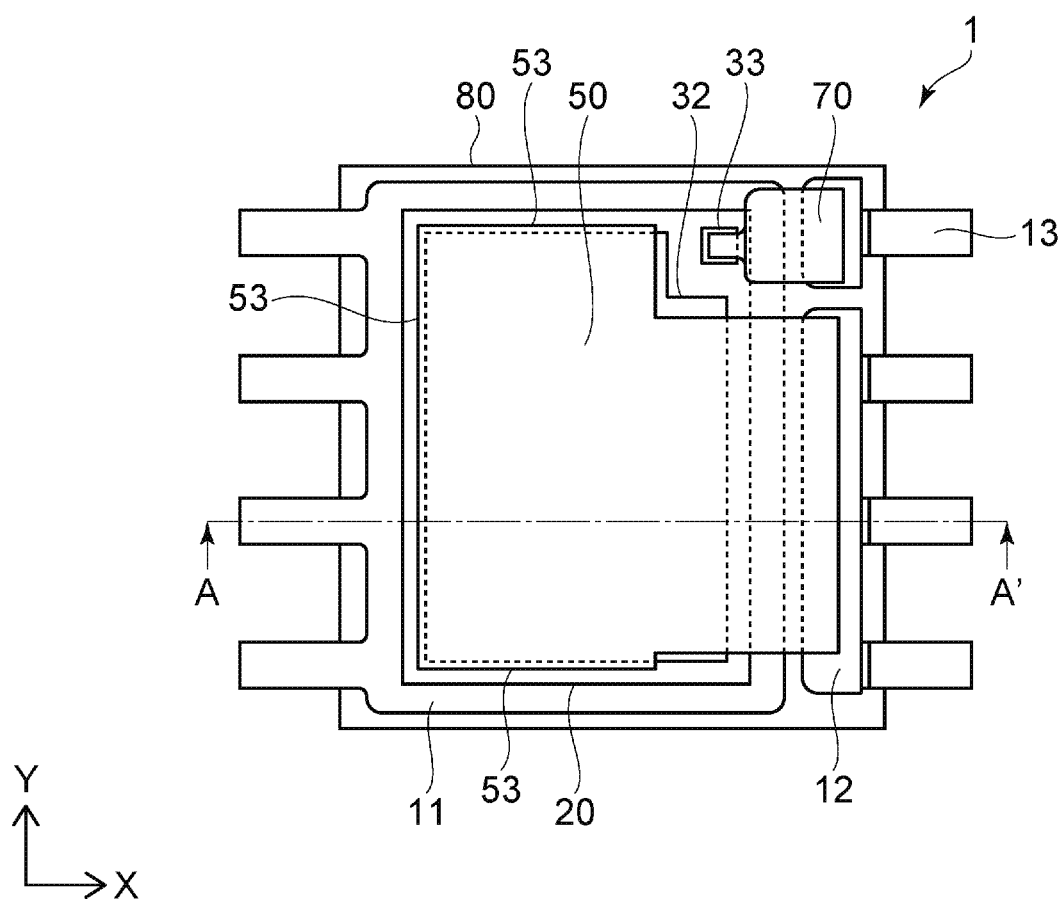
FIG. 1 is a schematic plan view of a semiconductor device of an embodiment.

FIG. 1 is a schematic plan view of a semiconductor device 1 of an embodiment.

Figure 2:
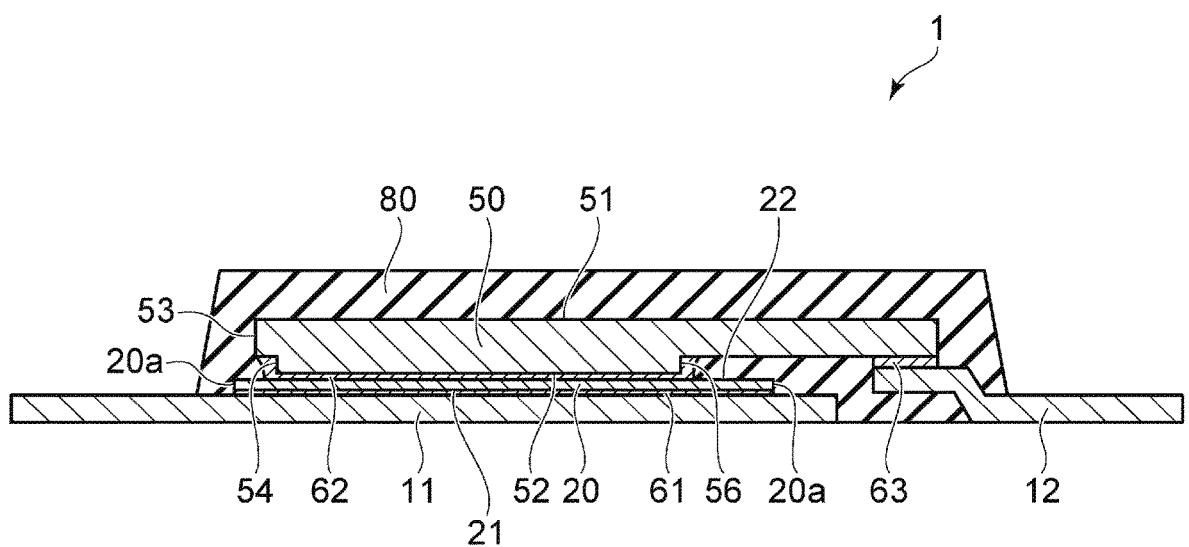
FIG. 2 is a cross-sectional view taken along the line A-A' of FIG. 1.

FIG. 2 is a cross-sectional view taken along the line A-A' of FIG. 1. A resin 80 illustrated in FIG. 2 is illustrated only as an outline in FIG. 1.

The semiconductor device 1 includes a semiconductor chip 20, a first frame 11, a second frame 12, a third frame 13, a first metal connector 50, a second metal connector 70, and the resin 80.

Figure 3A:
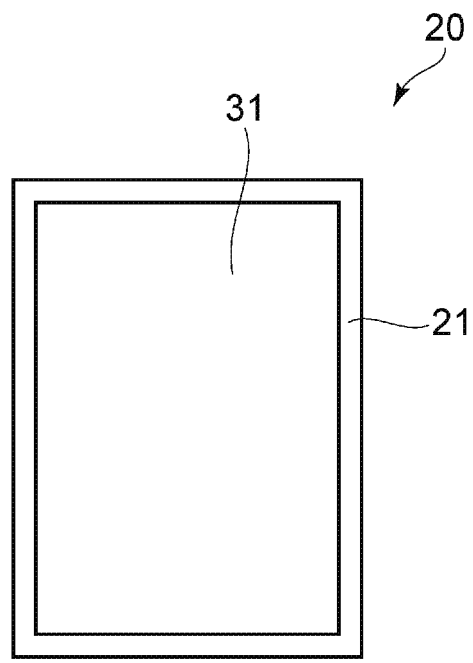
FIGS. 3A and 3B are schematic plan views of a semiconductor chip of an embodiment.
Figure 3B:
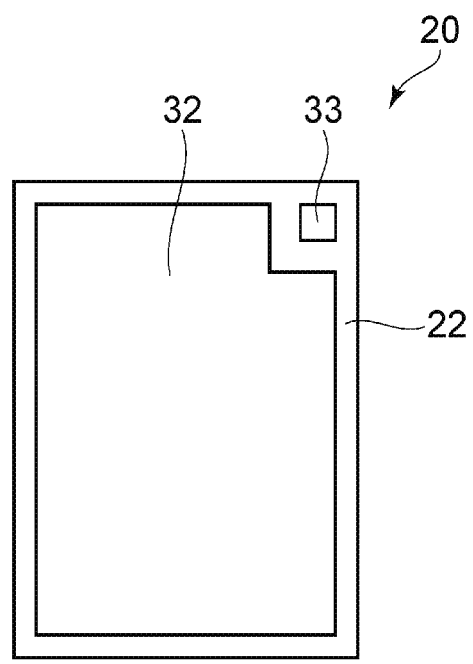

FIG. 3A is a schematic plan view of a first surface 21 of the semiconductor chip 20, and FIG. 3B is a schematic plan view of a second surface 22 on the side opposite to the first surface 21 of the semiconductor chip 20.

As illustrated in FIG. 3A, a first electrode 31 is provided on the first surface 21 of the semiconductor chip 20. As illustrated in FIG. 3B, a second electrode 32 and a third electrode 33 are provided on the second surface 22 of the semiconductor chip 20 while being insulated and separated from each other. An area (planar area) of the second electrode 32 is larger than an area (planar area) of the third electrode 33 as depicted in FIG. 3B.

The semiconductor chip 20 is a so called "vertical device" in which a current path is formed in a vertical direction (a thickness direction of the semiconductor chip 20) that connects the first electrode 31 and the second electrode 32. The semiconductor chip 20 is, for example, a vertical metal-oxide-semiconductor field effect transistor (MOSFET). In this case, the first electrode 31 functions as a drain electrode, the second electrode 32 functions as a source electrode, and the third electrode 33 functions as a gate electrode. Alternatively, the semiconductor chip 20 is a vertical insulated gate bipolar transistor (IGBT) or a vertical diode.

Silicon is used as a semiconductor material in this example. Alternatively, a semiconductor other than silicon (for example, a compound semiconductor such as silicon carbide (SiC) or gallium nitride (GaN)) may be used as the semiconductor material.

Two directions orthogonal to each other in a plane parallel to the first surface 21 of the semiconductor chip 20 or the second surface 22 thereof are defined as an X direction and a Y direction in FIG. 1.

The first frame 11, the second frame 12, and the third frame 13 are metal members for permitting electrical connections between an external circuit and the semiconductor chip 20. The second frame 12 and the third frame 13 are separated from each other in an XY plane direction. The insulating resin 80 illustrated in FIG. 2 is provided between the first frame 11 and the second frame 12, between the first frame 11 and the third frame 13, and between the second frame 12 and the third frame 13.

The first metal connector 50 is a plate-shaped metal member that electrically connects the second electrode 32 of the semiconductor chip 20 and the second frame 12, and mainly comprises copper, for example. The second metal connector 70 is a plate-shaped metal member that electrically connects the third electrode 33 of the semiconductor chip 20 and the third frame 13, and mainly comprises copper, for example.

The semiconductor chip 20 is mounted on the first frame 11. The first surface 21 of the semiconductor chip 20 faces the first frame 11, and the first electrode 31 is joined to an upper surface of the first frame 11 via a joining component 61. The joining component 61 is, for example, solder. Alternatively, the joining component 61 may be silver paste.

The first metal connector 50 is provided on the second surface 22 of the semiconductor chip 20. The semiconductor chip 20 is provided between the first frame 11 and the first metal connector 50. The second surface 22 of the semiconductor chip 20 faces the first metal connector 50, and the second electrode 32 is joined to the first metal connector 50 via a joining component 62. The joining component 62 is, for example, solder. Alternatively, the joining component 62 may be silver paste.

A part of the first metal connector 50 protrudes from an upper part of the first frame 11 toward the second frame 12, and is joined to the second frame 12 via a joining component 63. The joining component 63 is, for example, solder. Alternatively, the joining component 63 may be silver paste.

As illustrated in FIG. 1, the third electrode 33 of the semiconductor chip 20 and the third frame 13 are connected to each other via the second metal connector 70. The second metal connector 70 is joined to the third electrode 33 and the third frame 13 via a joining component (e.g., a solder or silver paste).

The resin 80 covers the semiconductor chip 20, the first metal connector 50, the second metal connector 70, and the joining components 61, 62, and 63. The resin 80 covers a joint part between the first frame 11 and the first electrode 31 of the semiconductor chip 20, a joint part between the second electrode 32 of the semiconductor chip 20 and the first metal connector 50, a joint part between the first metal connector 50 and the second frame 12, a joint part between the third electrode 33 of the semiconductor chip 20 and the second metal connector 70, and a joint part between the second metal connector 70 and the third frame 13.

Figure 4:
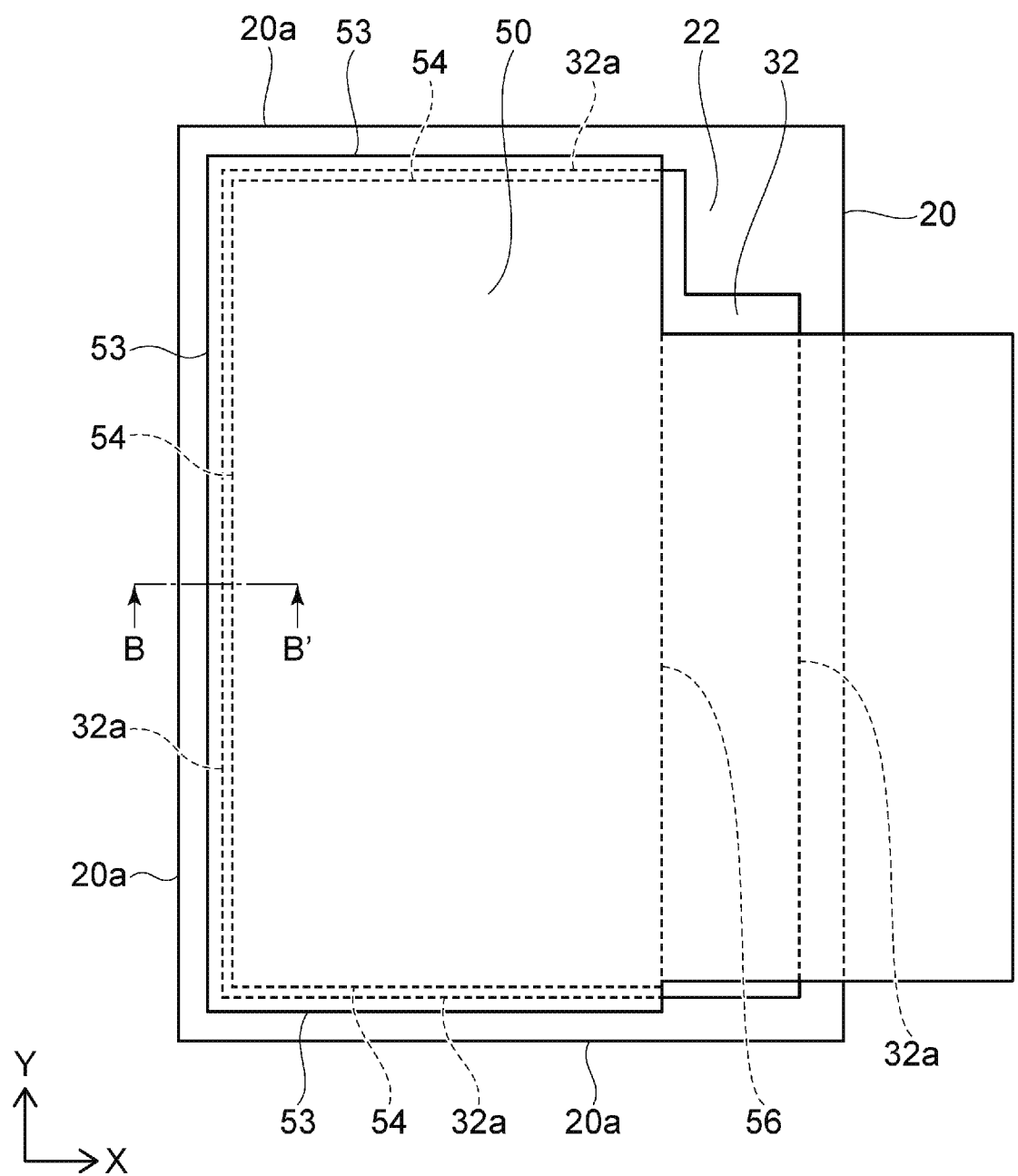
FIG. 4 is a schematic plan view of a semiconductor chip, a second electrode, and a metal connector in a semiconductor device of an embodiment.

FIG. 4 is a schematic plan view of the semiconductor chip 20, the second electrode 32, and the first metal connector 50 in the semiconductor device 1.

Figure 5:
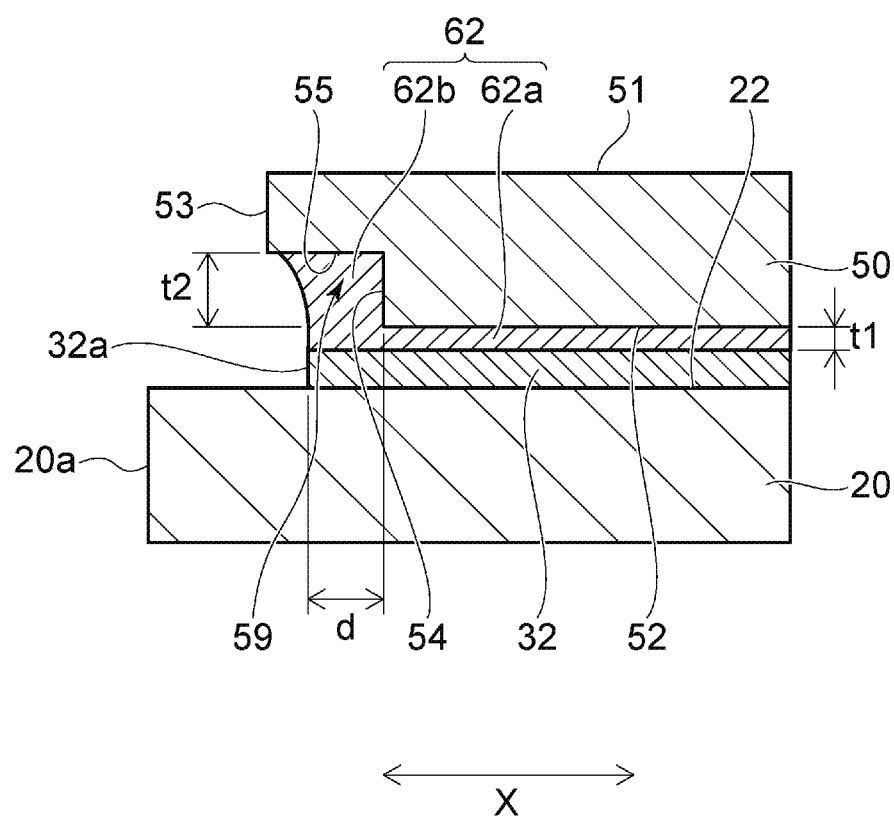
FIG. 5 is a cross-sectional view taken along the line B-B' of FIG. 4.

FIG. 5 is a cross-sectional view taken along the line B-B' of FIG. 4.

The first metal connector 50 includes an upper surface 51, a first lower surface 52, a second lower surface 55, a first end surface 53, and a second end surface 54.

The first lower surface 52 has a surface area generally larger than that of the second lower surface 55 and also faces the second electrode 32. A distance between the second lower surface 55 and the second surface 22 of the semiconductor chip 20 (a distance along a thickness direction of the semiconductor chip 20) is greater than a distance between the first lower surface 52 and the second surface 22 of the semiconductor chip (a distance along the thickness direction of the semiconductor chip 20). Likewise, a distance between the second lower surface 55 and an upper surface of the second electrode 32 (a distance along the thickness direction of the semiconductor chip 20) is greater than a distance between the first lower surface 52 and the upper surface of the second electrode 32 (a distance along the thickness direction of the semiconductor chip 20).

The first end surface 53 meets the upper surface 51 at a corner. The second end surface 54 meets the first lower surface 52 at a corner. The first end surface 53 protrudes beyond the second electrode 32 (more particularly an end surface 32a of the second electrode 32), and is not in a position overlapping (above) the second electrode 32. The second end surface 54 is at a position further retracted to the inside of the second electrode 32 than the first end surface 53 in the X direction (a first direction), and is in a position overlapped by the second electrode 32.

That is, the first end surface 53 and the second end surface 54 form a step in the X direction. One end in the X direction of the second lower surface 55 is continuous with the first end surface 53, and the other end in the X direction of the second lower surface 55 is continuous with the second end surface 54. The second lower surface 55 connects the first end surface 53 and the second end surface 54 which form the step.

The second lower surface 55 forms an upper surface of a step part 59 formed between the first end surface 53 and the second end surface 54, the first lower surface 52 does not extend below the step part 59, and the lower part of the step part 59 is thus open.

As depicted in FIG. 5, the end surface 32a of the second electrode 32 is at position in the X direction that is between the first end surface 53 of the first metal connector 50 and the second end surface 54 of the first metal connector 50.

The joining component 62 is provided between the second electrode 32 and the first metal connector 50, and joins the second electrode 32 and the first metal connector 50. The joining component 62 has a first portion 62a (between the first lower surface 52 of the first metal connector 50 and the second electrode 32) and a second portion 62b (between the second lower surface 55 of the first metal connector 50 and the second electrode 32). The second portion 62b covers the second lower surface 55 and the second end surface 54. A thickness t2 of the second portion 62b is thicker than a thickness t1 of the first portion 62a.

Figure 6:
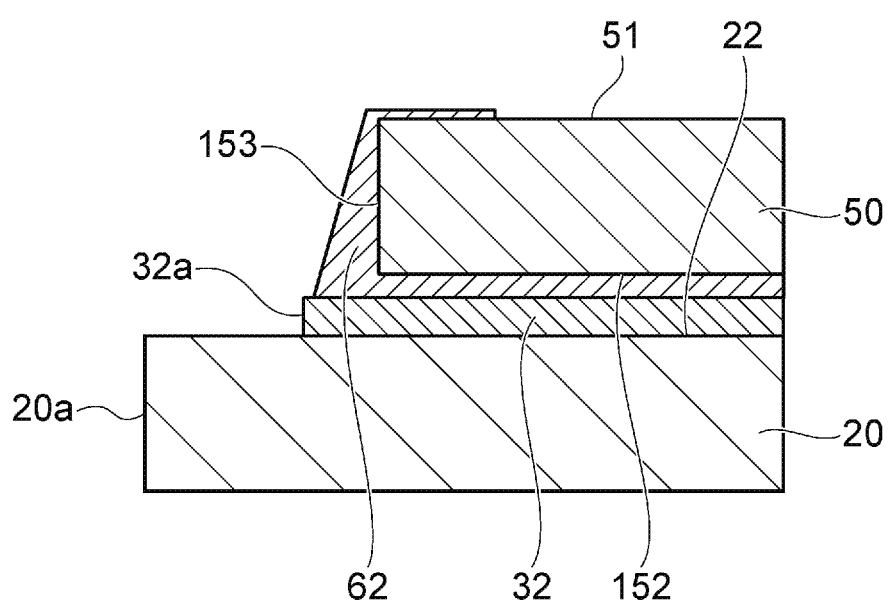
FIG. 6 is a schematic cross-sectional view of a semiconductor device of a comparative example.

FIG. 6 is a schematic cross-sectional view similar to FIG. 5 in a semiconductor device of a comparative example.

In this comparative example, a step part is not formed on an end surface 153 of the first metal connector 50. Since a linear expansion coefficient between the semiconductor chip 20 and the first metal connector 50 is different, stress is concentrated particularly on the end surface 153, and crack or peeling are likely to occur in the joining component 62 of the end surface 153. In order to relieve the stress, it can be considered to increase the amount of the joining component 62 used and to thus thicken the joining component 62 present on the end surface 153, but the thickness of the joining component 62 interposed between a lower surface 152 of the first metal connector 50 and the upper surface of the second electrode 32 is also thickened in such a case. This causes an undesirable increase in electrical resistance and thermal resistance between the first metal connector 50 and the second electrode 32.

According to the example embodiment, as illustrated in FIG. 5, the step part 59 is formed by the first end surface 53 and the second end surface 54, thereby making it possible not only to prevent any consequential increase in the thickness of the joining component 62 between the first lower surface 52 of the first metal connector 50 and the second electrode 32 with respect to increased electrical and thermal resistance, but still permitting a partial increase in the thickness of the joining component 62 at the end surface where the stress is likely to be concentrated. Accordingly, it is possible to prevent an increase in the electrical resistance and the thermal resistance between the first metal connector 50 and the second electrode 32, but also to improve strength (resistance) against the stress of the joining component 62 at the end surface.

For example, a total thickness of the first metal connector 50 is about 150 μm, and a length of the second end surface 54 (a length along the thickness direction of the first metal connector 50) is desirably equal to or greater than 50 μm.

While FIG. 5 depicts the meeting of the second end surface 54 and the second lower surface 55 to be a sharp corner, this is not necessarily a requirement of all examples. For example, a transition from the second end surface 54 to the second lower surface 55 may be via a curved surface. Similarly, the second end surface 54 may be an inclined surface that is angled with respect to the upper surface 51 or the first lower surface 52, or may be a rounded or curved surface. The second lower surface 55 may also be an inclined surface that is angled with respect to the upper surface 51 or the first lower surface 52, or may be a rounded or a curved surface.

In a structure of the comparative example illustrated in FIG. 6, molten solder when being applied for forming joining member 62 typically wets the end surface 153 and thus reaches the upper surface 51. The upper surface 51 of the first metal connector 50 is ultimately covered with the resin 80 (as illustrated in FIG. 2). Joint strength between the solder and the resin 80 is weaker than joint strength between metal and the resin 80, and when the still molten solder wets and spreads to the upper surface 51 of the first metal connector 50, peeling between at upper surface 51 (with solder thereon) and the resin 80 will more easily occur.

According to the embodiment, as illustrated in FIG. 5, the first end surface 53 protrudes further than the end surface 32a of the first electrode 32, and the solder used for forming the joining component 62 in the step part 59 thus finds it difficult to wet/spread all the way to the upper surface 51 due to the structure of the step part 59. Therefore, it is possible not only to prevent deterioration in the joint strength between the upper surface 51 of the first metal connector 50 and the resin 80, but also to improve reliability.

In the X direction, the first end surface 53 of the first metal connector 50 is located between an end surface 20a of the semiconductor chip 20 and the end surface 32a of the second electrode 32. That is, as illustrated in FIG. 4, the first end surface 53 is located in a region overlapping the semiconductor chip 20 positioned to be inside of the end surface 20a of the semiconductor chip 20. Accordingly, the first metal connector 50 and the semiconductor chip 20 can be recognized.

For example, when the solder is used as the joining component 62, the first metal connector 50 is self-aligned with respect to the second electrode 32 of the semiconductor chip 20 by melting of the solder. In order to prevent positional deviation between the second electrode 32 and the first metal connector 50 caused by this self-alignment, a distance d in the X direction from the end surface 32a of the second electrode 32 to the second end surface 54 of the first metal connector 50 is desirably within 0.1 mm.

The second end surface 54 is continuous in a direction along at least one side of the rectangular-shaped semiconductor chip 20. In the example illustrated in FIG. 4, the second end surface 54 is continuous along three sides of the semiconductor chip 20. However, this is not necessarily a limitation and other examples may adopt different configurations.

As illustrated in FIGS. 2 and 4, a second end surface 56 (that is, a step part) that is further retracted towards the interior direction of the second electrode 32 than the end surface of the second electrode 32 is also formed below a portion protruding toward the second frame 12 in the first metal connector 50. Therefore, the joining component 62 formed on the second end surface 56 (the step part) can be thickened in this part, thereby making it possible to improve the strength of an end part of the joint between the first metal connector 50 and the second electrode 32.

Additionally, the second end surface 54 (that is, the step part 59) may be partially formed on the first metal connector 50. For example, the second end surface 54 (the step part 59) may be partially formed only to be in the vicinity of a corner part of the first metal connector 50 where stress is considered to be concentrated.

In the above-described embodiment, the first metal connector 50 is electrically connected to the outside by being connected to the second frame 12 that is a separate component from the first metal connector 50, but a structure in which the first metal connector 50 and the second frame 12 are integrated may instead be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a frame;
   a semiconductor chip having a first surface facing the frame and a second surface facing away from the frame, the first surface being bonded to the frame, the second surface including an electrode thereon; and
   a metal connector plate joined to the electrode by a joining component between the electrode and the metal connector plate, wherein
   the metal connector plate has an upper surface facing away from the semiconductor chip, a first lower surface facing the electrode, a first end surface intersecting the first lower surface, a second lower surface facing towards the semiconductor chip and intersecting the first end surface, and a second end surface intersecting second lower surface and the upper surface,
   an end surface of the electrode is at a position along a first direction parallel the second surface that is between a position along the first direction of the first end surface and a position along the first direction of the second end surface,
   a distance between the second lower surface and the electrode is greater than a distance between the first lower surface and the electrode, and the joining component has a first portion between the first lower surface and the electrode and a second portion between the second lower surface and the electrode, the second portion contacting the first end surface and being thicker than the first portion.

2. The semiconductor device according to claim 1, wherein the position of second end surface is between a position along the first direction of an end surface of the semiconductor chip and the position of the end surface of the electrode.

3. The semiconductor device according to claim 2, wherein the joining component is solder.

4. The semiconductor device according to claim 3, wherein a distance in the first direction between the position of the end surface of the electrode and the position of the first end surface is 0.1 mm or less.

5. The semiconductor device according to claim 1, wherein the joining component is solder.

6. The semiconductor device according to claim 5, wherein the second end surface is continuous along at least one side of the semiconductor chip.

7. The semiconductor device according to claim 1, wherein the first end surface is continuous along at least one side of the semiconductor chip.

8. The semiconductor device according to claim 1, further comprising:
a second electrode on the second surface of the semiconductor chip, the second electrode having a planar area less than a planar area of the electrode.

9. The semiconductor device according to claim 8, wherein the metal connector plate does not contact the second electrode.

10. The semiconductor device according to claim 9, wherein the first end surface is continuous along three sides of the semiconductor chip.

11. The semiconductor device according to claim 1, further comprising:
a resin covering the metal connector plate and the semiconductor chip.

12. A packaged semiconductor device, comprising:
a first frame having a first surface;
a second frame spaced from the first frame in a first direction;
a semiconductor chip mounted on the first surface, the semiconductor chip having a first electrode on a first side facing the first surface and a second electrode on a second side facing away from the first frame; and
a connector plate having a lower surface that is joined to the second electrode by solder and an upper surface facing away from the second electrode, the connector plate having at least one edge including a change in height less than a full thickness of the connector plate, the change occurring at a position above the second electrode such that an outer edge of the lower surface on the at least one edge of the connector plate is inside an outer edge of the second electrode, an outer edge of the upper surface on the at least one edge of the connector plate being beyond the outer edge of the second electrode, the connector plate electrically connecting the second electrode to the second frame.

13. The packaged semiconductor device according to claim 12, further comprising:
a resin covering the connector plate, the semiconductor chip, at least a portion of the first frame, and at least a portion of the second frame.

14. The packaged semiconductor device according to claim 12, wherein
the semiconductor chip includes a third electrode on the second side, and
the connector plate does not cover the third electrode.

15. The packaged semiconductor device according to claim 12, wherein the position of the change is within 0.1 mm of the outer edge of the second electrode.

16. The packaged semiconductor device according to claim 12, wherein the change in height is substantially a step change in height such that the at least one edge of the connector plate includes an interior corner portion between the lower surface and an outermost end surface of the at least one edge of the connector plate.

17. The packaged semiconductor device according to claim 12, wherein the outer edge of at least three edges of the connector plate have the change in height.

18. A semiconductor device, comprising:
a first frame;
a second frame spaced from the first frame;
a semiconductor chip having a first electrode on a first surface facing the first frame and a second electrode on a second surface facing away from the first frame, the first electrode being electrically connected to the first frame; and
a connector plate joined to the second electrode with a solder and electrically connecting the second electrode to the second frame, wherein
the connector plate has an upper surface facing away from the semiconductor chip, a first lower surface facing the second electrode, a first end surface intersecting the first lower surface, a second lower surface facing towards the semiconductor chip and intersecting the first end surface, and a second end surface intersecting second lower surface and the upper surface,
an outer edge of the second electrode is at a position along a first direction that is parallel to the second surface that is between a position along the first direction of the first end surface and a position along the first direction of the second end surface,
a distance between the second lower surface and the second electrode is greater than a distance between the first lower surface and the second electrode, and
the solder has a first portion between the first lower surface and the second electrode and a second portion between the second lower surface and the second electrode, the second portion contacting the second end surface and being thicker than the first portion.

19. The semiconductor device according to claim 18, wherein a distance in the first direction between the outer edge of the second electrode and the position of the second end surface is 0.1 mm or less.

20. The semiconductor device according to claim 18, wherein the second end surface is continuous along at least three sides of the semiconductor chip.

* * * * *